US012796473B2

(12) United States Patent
Ahmed et al.

(10) Patent No.: US 12,796,473 B2
(45) Date of Patent: Nov. 10, 2026

(54) STIFFENER FOR A SEMICONDUCTOR PACKAGE

(71) Applicant: Juniper Networks, Inc., Sunnyvale, CA (US)

(72) Inventors: Omar Ahmed, Richmond Hill (CA); Bernard H. Glasauer, Saratoga, CA (US); Peng Su, San Jose, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 926 days.

(21) Appl. No.: 18/056,499

(22) Filed: Nov. 17, 2022

(65) Prior Publication Data

US 2024/0170417 A1 May 23, 2024

(51) Int. Cl.

| | |
|---|---|
| ***H10W 42/00*** | (2026.01) |
| ***H05K 1/181*** | (2026.01) |
| ***H10W 70/60*** | (2026.01) |
| ***H10W 70/685*** | (2026.01) |
| ***H10W 76/40*** | (2026.01) |
| ***H10W 76/47*** | (2026.01) |
| ***H10W 90/00*** | (2026.01) |

(52) U.S. Cl.

CPC .......... *H10W 42/121* (2026.01); *H05K 1/181* (2013.01); *H10W 70/611* (2026.01); *H10W 70/685* (2026.01); *H10W 76/40* (2026.01); *H10W 76/47* (2026.01); *H10W 90/701* (2026.01)

(58) Field of Classification Search

CPC . H01L 23/562; H01L 23/49816; H01L 23/04; H01L 23/36; H01L 23/16; H05K 1/181; H05K 3/301; H05K 3/3436; H10W 40/10; H10W 42/121; H10W 70/611; H10W 70/685; H10W 76/12; H10W 76/40; H10W 76/47; H10W 90/00; H10W 90/701

See application file for complete search history.

(56) References Cited

U.S. PATENT DOCUMENTS

| | | | | |
|---|---|---|---|---|
| 10,943,874 | B1 | 3/2021 | Su et al. | |
| 2009/0323295 | A1 | 12/2009 | Houle et al. | |
| 2015/0035131 | A1 | 2/2015 | Ko et al. | |
| 2015/0262904 | A1* | 9/2015 | Hung | H01L 25/0657 257/713 |
| 2016/0358865 | A1* | 12/2016 | Shih | H01L 21/6835 |
| 2020/0411448 | A1* | 12/2020 | Goh | H01L 23/552 |
| 2021/0193538 | A1* | 6/2021 | Huang | H01L 23/3675 |

OTHER PUBLICATIONS

Partial European Search Report for Application No. EP23151792.1, mailed on Aug. 14, 2023, 14 Pages.

Extended European Search Report for Application No. EP231517921 mailed on Dec. 22, 2023, 14 page.

* cited by examiner

*Primary Examiner* — Matthew E Warren

(74) *Attorney, Agent, or Firm* — Harrity & Harrity, LLP

(57) ABSTRACT

In some implementations, an apparatus includes a substrate having a top surface and a bottom surface, a first array of connectors on the bottom surface of the substrate, a semiconductor device disposed on the top surface of the substrate, and a stiffener having a connection portion that extends along at least a portion of a side edge of the substrate. A bottom surface of the connection portion may be coplanar with the bottom surface of the substrate. The apparatus may include a second array of connectors on the bottom surface of the connection portion.

20 Claims, 9 Drawing Sheets

STIFFENER FOR A SEMICONDUCTOR PACKAGE

BACKGROUND

A semiconductor package includes one or more semiconductor devices, such as one or more integrated circuits. Semiconductor device components may be fabricated on semiconductor wafers, diced into dies, and then packaged. A semiconductor package may include elements, such as balls, pins, or leads, for connecting components of the semiconductor package to an external component (e.g., a circuit board).

SUMMARY

In some implementations, a semiconductor package includes a substrate having a top surface and a bottom surface, a first ball grid array on the bottom surface of the substrate, a semiconductor device disposed on the top surface of the substrate, and a stiffener disposed on the top surface of the substrate and surrounding the semiconductor device. The stiffener may include a connection portion that overhangs the substrate and extends toward the bottom surface of the substrate. A bottom surface of the connection portion may be coplanar with the bottom surface of the substrate. The semiconductor package may include a second ball grid array on the bottom surface of the connection portion.

In some implementations, an apparatus includes a substrate having a top surface and a bottom surface, a first array of connectors on the bottom surface of the substrate, a semiconductor device disposed on the top surface of the substrate, and a stiffener having a connection portion that extends along at least a portion of a side edge of the substrate. A bottom surface of the connection portion may be coplanar with the bottom surface of the substrate. The apparatus may include a second array of connectors on the bottom surface of the connection portion.

In some implementations, a stiffener for a semiconductor package may include a frame having a top surface, a bottom surface, and a central opening extending through the top surface and the bottom surface, and a connection portion extending from the frame perpendicular to the bottom surface.

DETAILED DESCRIPTION

Figure 1A:
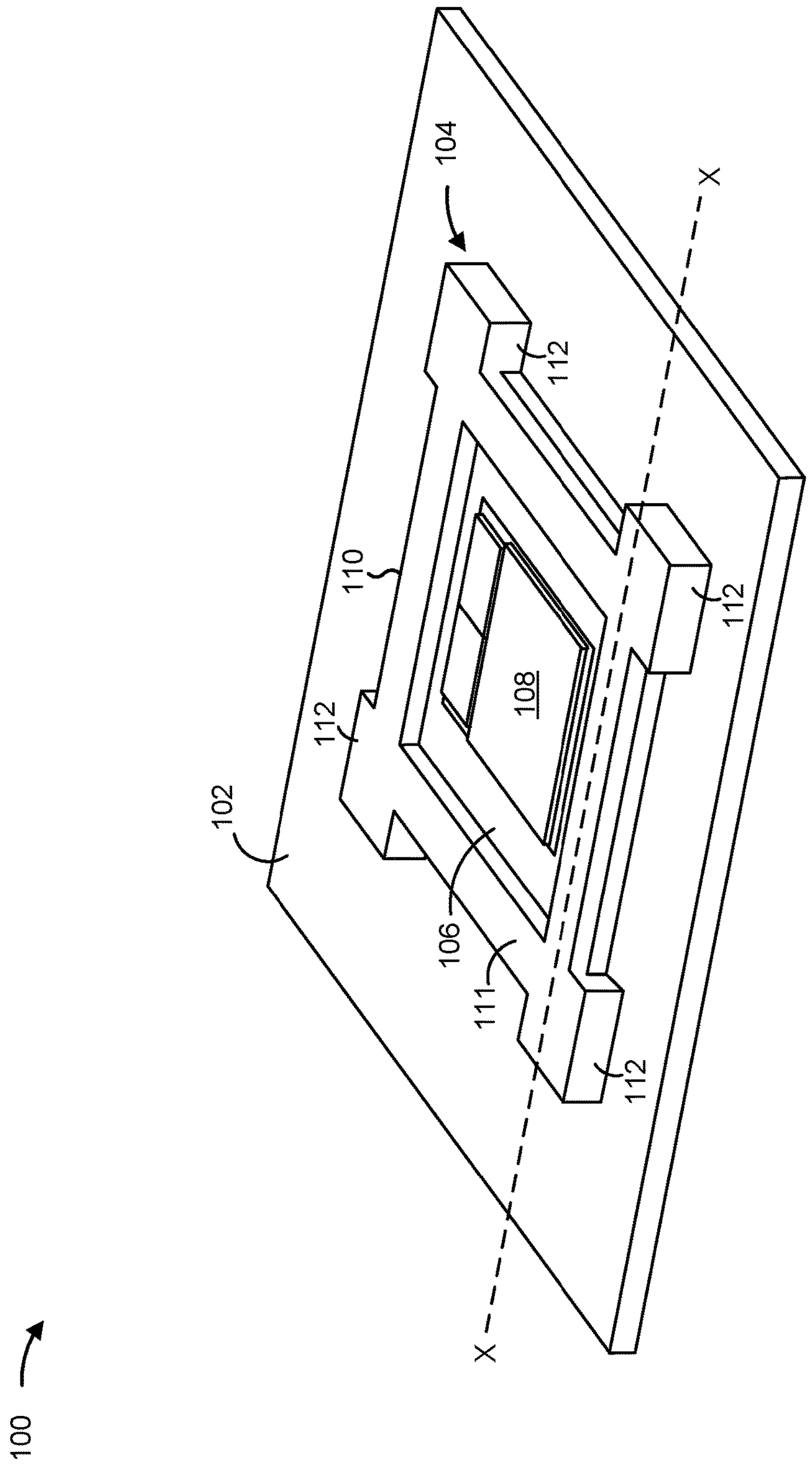
FIG. 1A is a perspective view of an example apparatus.

The following detailed description of example implementations refers to the accompanying drawings. The same reference numbers in different drawings may identify the same or similar elements.

A semiconductor package may be mounted to a circuit board by solder connections. For example, the semiconductor package may include a ball grid array (BGA) that facilitates connection of the semiconductor package and the circuit board by numerous solder connections (e.g., solder joints). In some cases, the semiconductor package and/or the circuit board may have a tendency to flex or bow from temperature changes at the semiconductor package during operation. This may create significant stress on the solder connections, particularly with larger semiconductor dies and larger semiconductor packages (e.g., recent application-specific integrated circuit (ASIC) devices have increased in size and complexity). In addition to die and package size, the lifetime of solder connections may also be affected by a semiconductor package substrate material, a circuit board material, and/or a configuration of vias.

When solder connections between the semiconductor package and the circuit board are unreliable and/or unable to withstand frequent temperature changes, damage (e.g., fracturing) to the solder connections may occur. Solder connections at corner regions of the semiconductor package may be particularly susceptible to damage. Damage to one or more solder connections may affect the exchange of electrical signals between the semiconductor package and the circuit board, thereby impairing a functionality of the semiconductor package.

In some cases, to mitigate solder connection damage, solder balls of a BGA may be eliminated at corner regions of the semiconductor package, as these areas undergo significant stress and are most susceptible to solder connection damage, as described above. However, de-population of solder balls reduces the quantity of connections between the semiconductor package and the circuit board, thereby creating routing challenges. In some other cases, edge bonding of the semiconductor package to the circuit board may be used to mitigate solder connection damage. Here, an adhesive (e.g., an epoxy adhesive) may be applied along edges of a substrate of the semiconductor package, at an interface between the substrate and the circuit board, to bond the substrate to the circuit board. However, edge bonding adds additional processing steps, complexity, and cost. Moreover, edge bonding makes it difficult to replace or repair the semiconductor package and/or the circuit board. Furthermore, edge bonding is associated with a "keep out" area on the circuit board to provide sufficient room for the adhesive, thereby inefficiently utilizing scarce circuit board space.

Some implementations described herein provide a stiffener, for a semiconductor package, that is configured for mechanical connection to a circuit board. For example, the stiffener may be disposed on a substrate of the semiconductor package surrounding a semiconductor device of the semiconductor package. Moreover, the stiffener may include a connection portion that overhangs the substrate and extends toward a bottom surface of the substrate. For example, a bottom surface of the connection portion may be level with the bottom surface of the substrate. The bottom surfaces of the connection portion and of the substrate may both include connectors (e.g., solder balls) for connection with the circuit board. For example, solder connections between the semiconductor package and the circuit board may be at the substrate and at the connection portion of the stiffener.

The connections between the connection portion and the circuit board may be "dummy" connections that have the purpose of increasing the strength of the mechanical connection between the semiconductor package and the circuit board. Thus, the stiffener improves a resistance of the semiconductor package and/or of the circuit board to flexing or bowing under temperature fluctuations. In this way, stress and damage to connections between the substrate and the circuit board may be reduced, thereby increasing a useful life of the connections. For example, the stiffener described herein may increase fatigue life at solder joints by more than 100% relative to prior devices.

Moreover, because the connections between the connection portion and the circuit board increase the strength of the mechanical connection between the semiconductor package and the circuit board outside of the substrate, connectors (e.g., solder balls) of the substrate may extend fully to the corners of the substrate, thereby maximizing the quantity of connectors and improving routing. In addition, stress from flexing or bowing of the semiconductor package and/or of the circuit board may be shifted from active connections between the substrate of the semiconductor package and the circuit board to the dummy connections between the connection portion and the circuit board. Accordingly, if the dummy connections between the connection portion and the circuit board were to be damaged due to flexing or bowing of the semiconductor package, the functionality of the semiconductor package would not suffer.

Figure 1B:
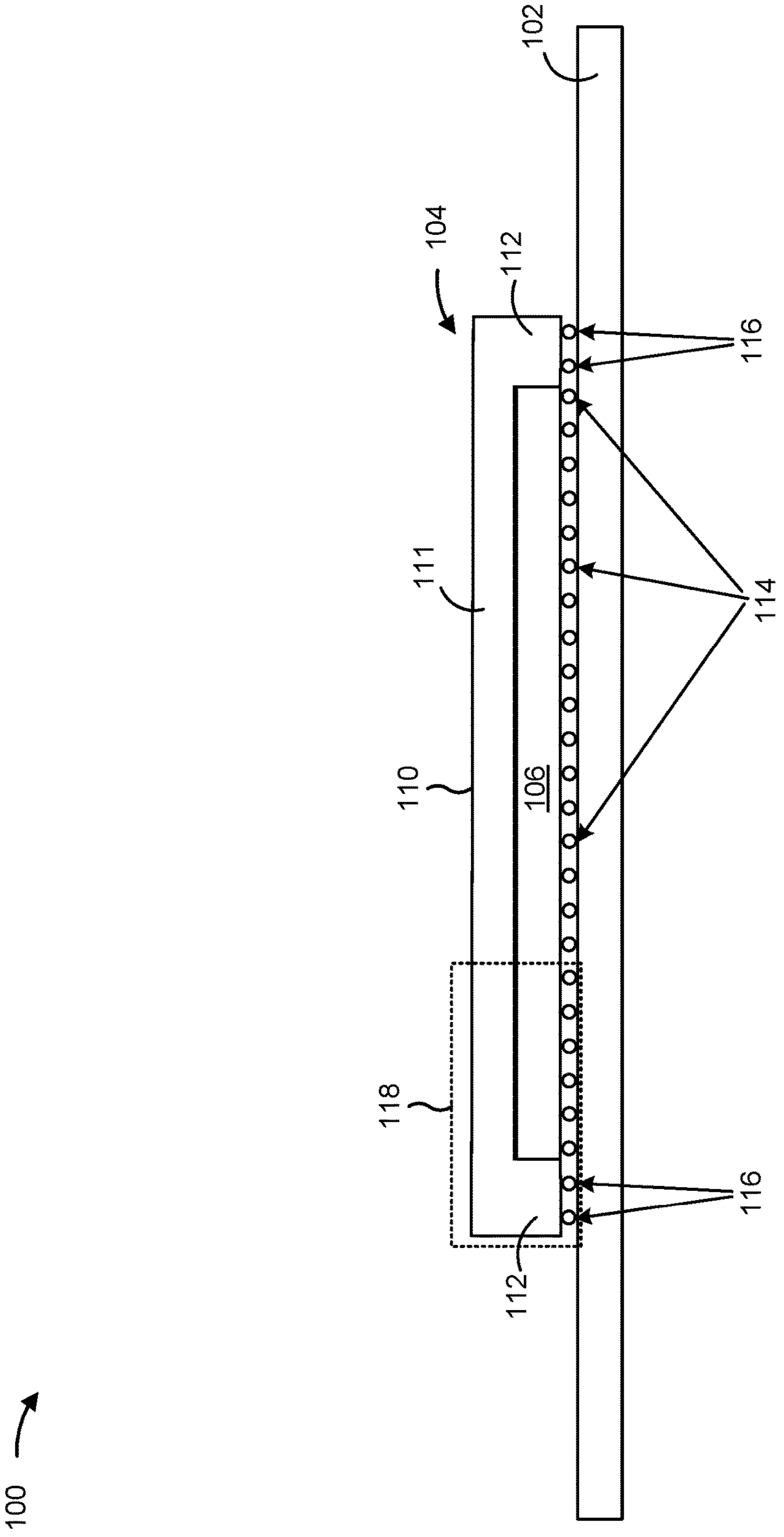
FIG. 1B is a cross-sectional view of the apparatus of FIG. 1A taken along line X-X.
Figure 1C:
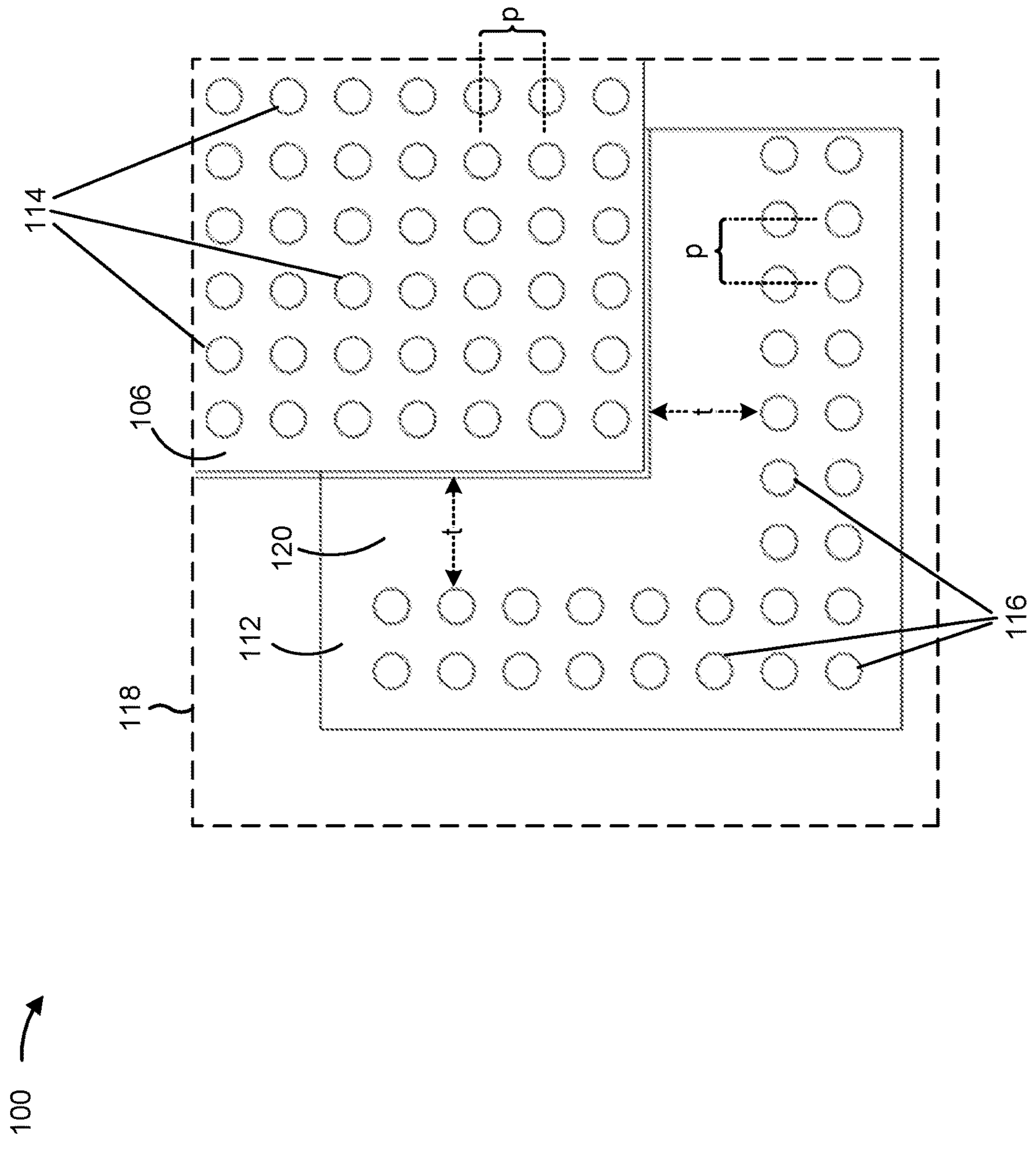
FIG. 1C is a bottom view of a portion of the apparatus of FIG. 1A.

FIG. 1A is a perspective view of an example apparatus 100, FIG. 1B is a cross-sectional view of the apparatus 100 taken along line X-X, and FIG. 1C is a bottom view of a portion of the apparatus 100. As shown in FIGS. 1A-1B, the apparatus 100 may include a circuit board 102 (e.g., a printed circuit board (PCB)) and a semiconductor package 104 (which may also be referred to as a semiconductor device assembly) disposed on, and connected to, the circuit board 102.

The semiconductor package 104 may include a substrate 106 having a top surface and a bottom surface. The substrate 106 may include a conductive or semi-conductive material (e.g., silicon, aluminum, and/or copper, among other examples), may include a PCB material, or the like. The substrate 106 may be sized and shaped to support one or more semiconductor devices 108. That is, the semiconductor package 104 may include one or more semiconductor devices 108 disposed on the top surface of the substrate 106. The semiconductor device(s) 108 may be electrically connected to the substrate 106 (e.g., by flip-chip bonding and/or by wire bonding).

A semiconductor device 108 may include one or multiple semiconductor dies (e.g., in a stacked arrangement). A semiconductor device 108 may include an integrated circuit chip. In some implementations, a semiconductor device 108 may include an ASIC, which may include an integrated circuit chip that is customized for a particular use, rather than intended for a general-purpose use. Additionally, or alternatively, a semiconductor device 108 may include an application-specific standard product (ASSP) chip or an industry standard integrated circuit chip, among other examples. Additionally, or alternatively, a semiconductor device 108 may include a memory device (e.g., a device configured to store information), such as a high bandwidth memory (HBM) device that provides a high-speed computer memory interface for three dimensional-stacked synchronous dynamic random-access memory (SDRAM). In some implementations, the semiconductor package 104 may include an ASIC and one or more (e.g., two) memory devices.

In some implementations, the semiconductor package 104 may be a lidless semiconductor package. In the lidless semiconductor package, the semiconductor device(s) 108 may be exposed to allow for direct contact between the semiconductor device(s) 108 and a heat sink (not shown), thereby improving the thermal performance of the semiconductor package 104.

The semiconductor package 104 may include a stiffener 110 (which may also be referred to as a stiffener plate, a stiffener frame, or the like). The stiffener 110 may be disposed on the top surface of the substrate 106 and may surround the semiconductor device(s) 108. For example, the stiffener 110 may be provided on a first portion (e.g., a perimeter portion) of the top surface of the substrate 106, and the semiconductor device(s) 108 may be provided on a second portion (e.g., a central portion) of the top surface of the substrate 106. The second portion of the substrate 106 may be separate from the first portion of the substrate 106. Thus, the stiffener 110 may be spaced from and may surround the semiconductor device(s) 108. The stiffener 110 may include a frame 111 (e.g., a frame-like structure) having a top surface, a bottom surface, and a central opening extending through the top surface and the bottom surface, such that the stiffener 110 does not cover a central portion of the substrate 106. The stiffener 110 may reinforce the substrate 106 by adding a reinforcing border around the semiconductor device(s) 108. In this way, the stiffener 110 may prevent or reduce bending or flexing of the semiconductor package 104. The stiffener 110 may be composed of a rigid material, such as silicon, one or more metals (e.g., aluminum, copper, and/or an alloy, among other examples), a polymeric material (e.g., silicone rubber mixed with aluminum particles and zinc oxide), or the like. In some implementations, the stiffener 110 (e.g., the frame 111) may be affixed to the top surface of the substrate 106 by an adhesive, an adhesive tape, an adhesive film, or the like.

The stiffener 110 may include one or more connection portions 112 that extend from the stiffener 110 (e.g., extend from the frame 111). For example, the connection portion(s) 112 may extend from the frame 111 perpendicular to the bottom surface of the frame 111. The frame 111 and the connection portion(s) 112 may be an integral structure. A connection portion 112 may extend along at least a portion of a perimeter of the frame 111. Thus, the connection portion 112 may extend along at least a portion of a side edge (e.g., between the top surface and the bottom surface) of the substrate 106. In some implementations, a connection portion 112 may overhang the substrate 106 (e.g., extend outside of the body of the semiconductor package 104 defined by the substrate 106) and extend toward the bottom surface of the substrate 106 (e.g., a connection portion 112 may be a portion of the stiffener 110 configured to overhang the substrate 106). For example, a bottom surface of a connection portion 112 may be coplanar with the bottom surface of the substrate 106 (e.g., the bottom surface of the connection portion 112 is level with the bottom surface of the substrate 106). In some implementations, the stiffener 110 (e.g., the connection portion 112) may be affixed to the side edge of the substrate 106 by an adhesive, an adhesive tape, an adhesive film, or the like.

As shown in FIG. 1A, the stiffener 110 may include multiple connection portions 112. For example, the stiffener 110 may include four connection portions 112. Here, a first connection portion 112 may extend from a first corner of the stiffener 110 (e.g., of the frame 111), a second connection portion 112 may extend from a second corner of the stiffener 110 (e.g., of the frame 111), a third connection portion 112 may extend from a third corner of the stiffener 110 (e.g., of the frame 111), and a fourth connection portion 112 may extend from a fourth corner of the stiffener 110 (e.g., of the frame 111). A connection portion 112 may be L-shaped with respect to a square-shaped or rectangular-shaped frame 111. In some implementations, the stiffener 110 may include less than four connection portions 112 or more than four connection portions 112. In some implementations, one or more connection portions 112 may extend from edges of the stiffener 110 in between corners of the stiffener 110 (e.g., extend from edges of the frame 111 in between corners of the frame 111). In some implementations, a connection portion 112 may extend along an entirety of the perimeter of the frame 111. Thus, the connection portion 112 may extend along an entirety of the side edge (e.g., between the top surface and the bottom surface) of the substrate 106.

As shown in FIG. 1B, the semiconductor package 104 may include a first array of (e.g., a plurality of) connectors 114 on the bottom surface of the substrate 106. The connectors 114, of the first array of connectors 114, may include solder balls. For example, the first array of connectors 114 may be a ball grid array. The first array of connectors 114 may have electrical connections to the substrate 106. Moreover, the first array of connectors 114 may be configured to provide a connection between the substrate 106 and the circuit board 102. For example, the first array of connectors 114 may form joints (e.g., solder joints) at respective bond pads (not shown), or other connection points, of the circuit board 102. In particular, the first array of connectors 114 may provide a mechanical connection, and a communicative connection, between the semiconductor package 104 and the circuit board 102. That is, to provide the communicative connection, the first array of connectors 114 may provide paths for electrical signals between the semiconductor package 104, and in particular the semiconductor device(s) 108, and the circuit board 102 (e.g., the connectors 114 are active connectors).

The semiconductor package 104 may include a second array of connectors 116 (e.g., two rows of connectors) on a bottom surface of a connection portion 112 (e.g., each connection portion 112 may include a respective array of connectors 116). The connectors 116, of the second array of connectors 116, may include solder balls. For example, the second array of connectors 116 may be a ball grid array. The second array of connectors 116 may be electrically isolated from the substrate 106. The second array of connectors 116 may be configured to provide connection between the connection portion 112 and the circuit board 102. For example, the second array of connectors 116 may form joints (e.g., solder joints) at respective bond pads (not shown), or other connection points, of the circuit board 102. In particular, the second array of connectors 116 may provide a mechanical connection, without providing a communicative connection, between the semiconductor package 104 and the circuit board 102. That is, the second array of connectors 116 may not provide paths for electrical signals between the semiconductor package 104, and in particular the semiconductor device(s) 108, and the circuit board 102 (e.g., the connectors 116 are inactive connectors).

In other words, the connectors 116, of the second array of connectors 116, may be dummy connectors, that provide a dummy connection to the circuit board 102, and that have the purpose of increasing the strength of a mechanical connection between the semiconductor package 104 and the circuit board 102, thereby improving a resistance of the semiconductor package 104 and/or the circuit board 102 to flexing or bowing under temperature fluctuations. In this way, stress and damage to active connections between the semiconductor package 104 and the circuit board 102 may be reduced, thereby increasing a useful life of the active connections. For example, in a prior device, solder joints may experience a stress of about 151 megapascals (MPa), whereas stress at solder joints may be decreased to about 76 MPa (e.g., using a lesser setback area, as described below) or to about 74 MPa (e.g., using a greater setback area, as described below) using the stiffener 110. In addition, in a prior device, a normalized characteristic life of solder joints may be about 1 cycle, whereas a normalized characteristic life may be about 2.8 cycles (e.g., using a lesser setback area, as described below) or about 3.8 cycles (e.g., using a greater setback area, as described below) using the stiffener 110.

Moreover, the second array of connectors 116, by providing mechanical connection between the semiconductor package 104 and the circuit board 102 outside of the substrate 106, facilitate the first array of connectors 114 to extend to corners of the substrate 106, thereby increasing a quantity of the connectors 114 (e.g., relative to when depopulation is used to mitigate damage to connectors) and improving routing. For example, the first array of connectors 114 may have an overall shape of a square or a rectangle (e.g., rather than a square or a rectangle that is truncated at one or more corners).

FIG. 1C shows a bottom view of a portion of the semiconductor package 104 designated by reference number 118 in FIG. 1B. FIG. 1C shows the first array of connectors 114 on the substrate 106 and the second array of connectors 116 on the connection portion 112. In some implementations, as shown, the second array of connectors 116 may be spaced from the first array of connectors 114 by a setback area 120 of the connection portion 112. A thickness (shown by t), such as a minimum thickness, of the setback area 120 may be greater than a pitch (shown by p) of the first array of connectors 114 and/or the second array of connectors 116. In some implementations, the pitch p may be about 1 millimeter (mm). In some implementations, the thickness t may be about 2 mm or more, or about 3 mm or more. The setback area 120 may facilitate routing for the first array of connectors 114. Moreover, increasing the thickness t of the setback area 120 may increase a fatigue life associated with connections formed by the first array of connectors 114. In some implementations, the thickness t, such as the minimum thickness, of the setback area 120 may be equal to or less than the pitch p of the first array of connectors 114 and/or the second array of connectors 116, thereby facilitating reduction to a size of the connection portion 112. For example, the thickness t of the setback area 120 may be less than about 2 mm, or about 1 mm or less.

In some implementations, a solder mask layer may be disposed on the bottom surface of a connection portion 112. The solder mask layer may include a plurality of openings (e.g., circular openings). For example, a photolithography procedure may be performed on the solder mask layer to form the openings. These openings may define and control locations of the connectors 116 (e.g., of the solder balls). For example, the connectors 116 may be arranged in the openings.

In some implementations, a method (e.g., performed by semiconductor manufacturing equipment) may include applying (e.g., placing) the semiconductor package 104 to the circuit board 102. The method may include bonding the semiconductor package 104 to the circuit board 102 at the first array of connectors 114 and at the second array of connectors 116. In some implementations, bonding the semiconductor package 104 to the circuit board 102 may include performing a reflow operation.

As indicated above, FIGS. 1A-1C are provided as an example. Other examples may differ from what is described with regard to FIGS. 1A-1C.

Figure 2A:
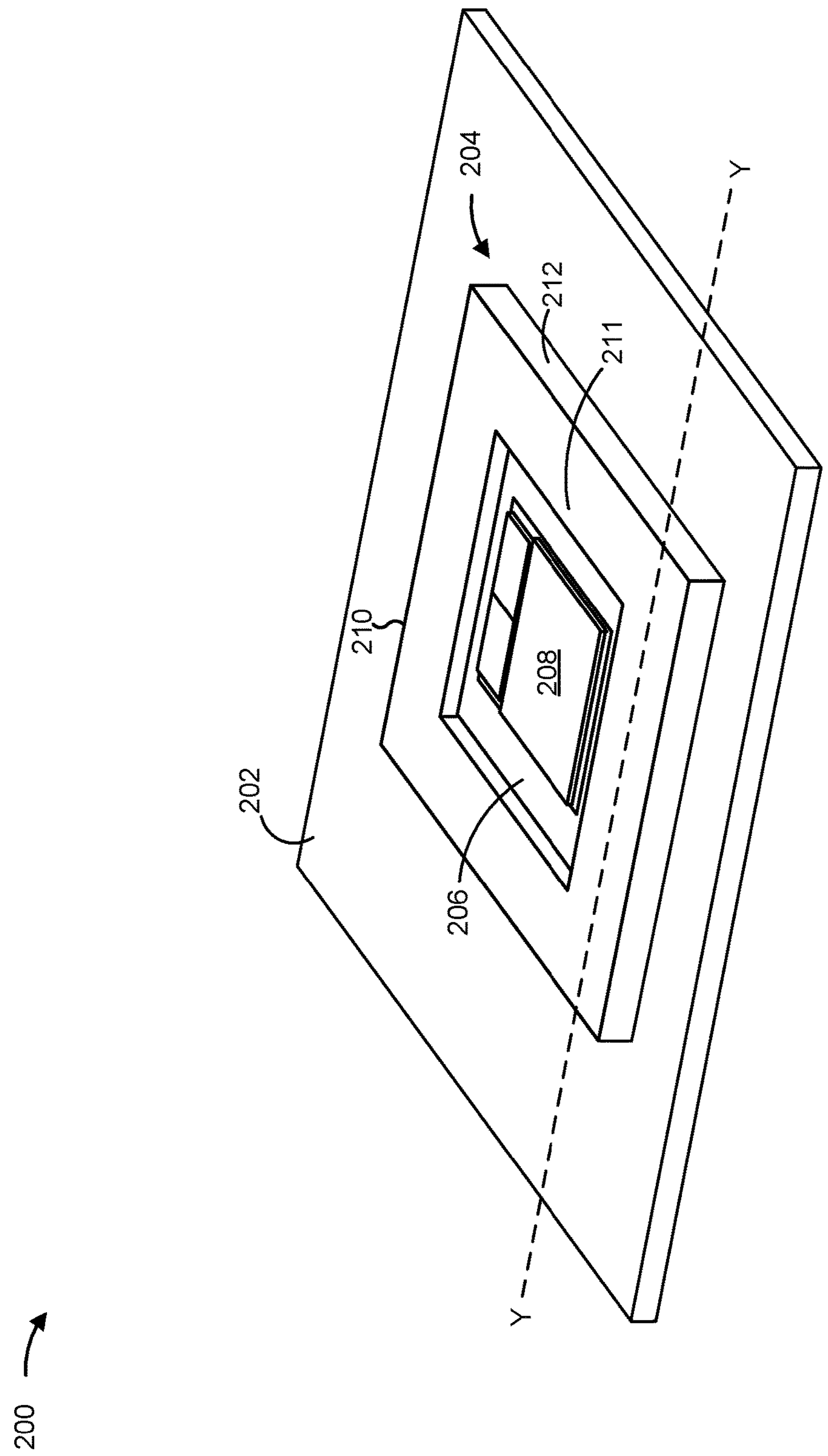
FIG. 2A is a perspective view of an example apparatus.
Figure 2B:
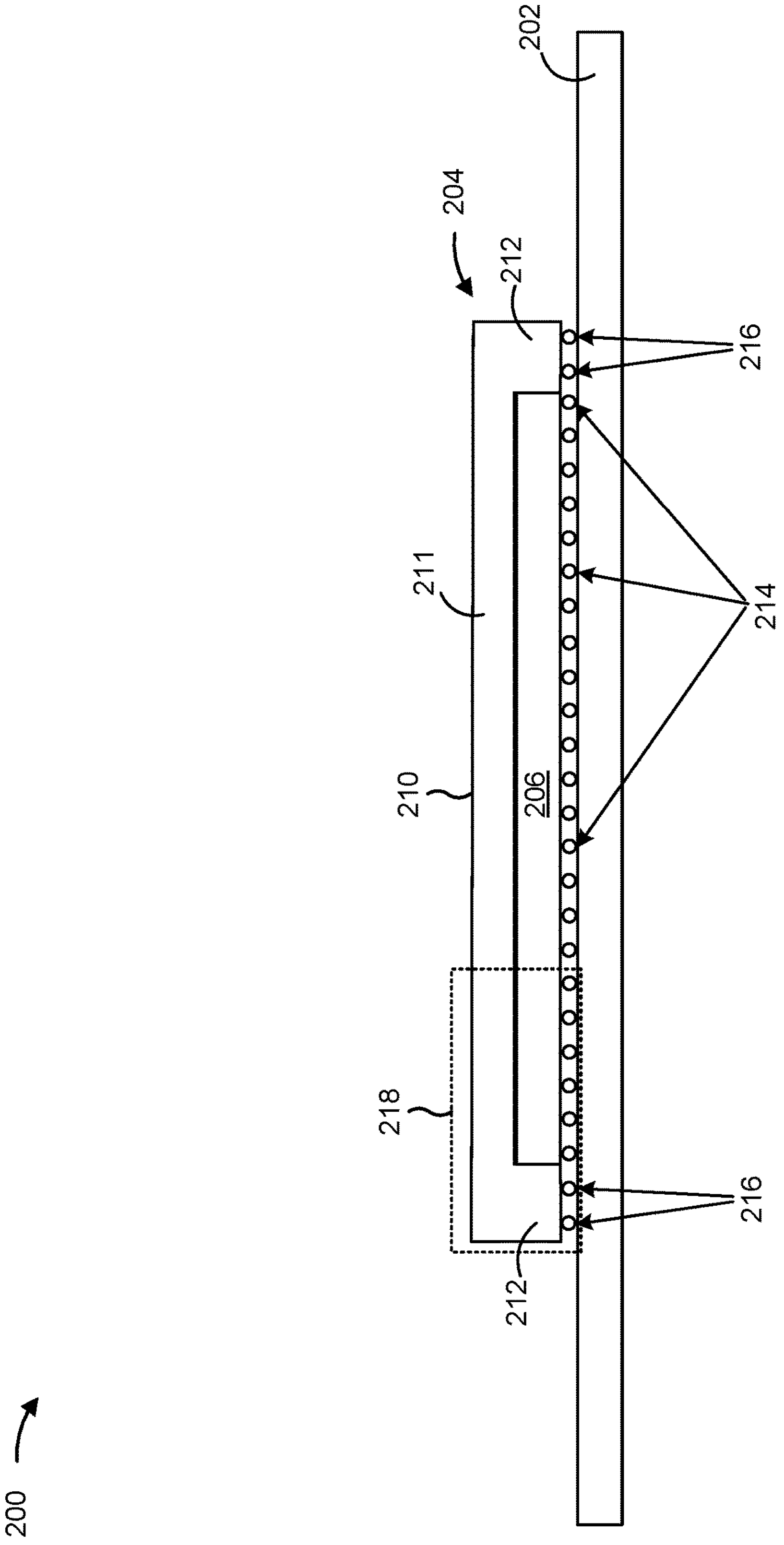
FIG. 2B is a cross-sectional view of the apparatus of FIG. 2A taken along line Y-Y.
Figure 2C:
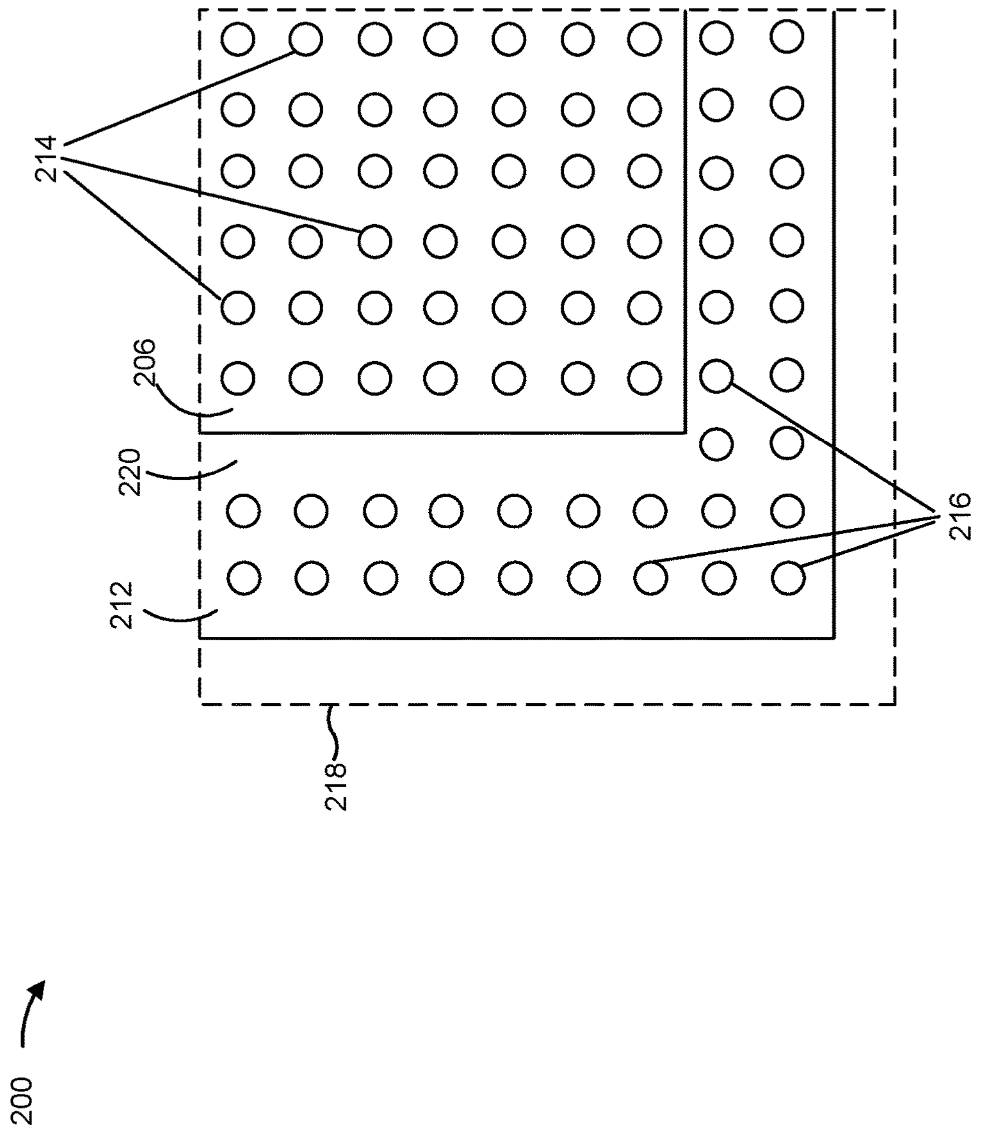
FIG. 2C is a bottom view of a portion of the apparatus of FIG. 2A.

FIG. 2A is a perspective view of an example apparatus 200, FIG. 2B is a cross-sectional view of the apparatus 200 taken along line Y-Y, and FIG. 2C is a bottom view of a portion of the apparatus 100. As shown in FIGS. 2A-2B, the apparatus 200 may include a circuit board 202 and a semiconductor package 204 disposed on, and connected to, the circuit board 202, as described in connection with the apparatus 100. The semiconductor package 204 may include a substrate 206, having a top surface and a bottom surface, and one or more semiconductor devices 208, disposed on the top surface of the substrate 206, as described in connection with the apparatus 100. The semiconductor package 204 may include a stiffener 210, disposed on the substrate 206 and surrounding the semiconductor device(s) 208, as described in connection with the apparatus 100.

The stiffener 210 may include a frame 211 and a connection portion 212, that extends from the stiffener 210 (e.g., from the frame 211), as described in connection with the apparatus 100. For example, the connection portion 212 may overhang the substrate 206 and extend toward the bottom surface of the substrate 206 (e.g., the connection portion 212 may be a portion of the stiffener 210 that overhangs the substrate 206). As an example, a bottom surface of the connection portion 212 may be coplanar with the bottom surface of the substrate 206. As shown in FIGS. 2A-2B, the connection portion 212 may extend along an entirety of a perimeter of the frame 211. Thus, the connection portion 212 may extend along an entirety of a side edge (e.g., between the top surface and the bottom surface) of the substrate 206.

As shown in FIG. 2B, the semiconductor package 204 may include a first array of (e.g., a plurality of) connectors 214, on the bottom surface of the substrate 206, as described above in connection with the apparatus 100. The semiconductor package 204 may include a second array of connectors 216, on a bottom surface of the connection portion 212, as described above in connection with the apparatus 100. For example, connectors 216, of the second array of connectors 216, may be dummy connectors, that provide a dummy connection to the circuit board 202, and that have the purpose of increasing the strength of a mechanical connection between the semiconductor package 204 and the circuit board 202, as described herein. For example, in a prior device, solder joints may experience a stress of about 151 MPa, whereas stress at solder joints may be decreased to about 73 MPa using the stiffener 210. In addition, in a prior device, a normalized characteristic life of solder joints may be about 1 cycle, whereas a normalized characteristic life may be about 3.06 cycles using the stiffener 210.

FIG. 2C shows a bottom view of a portion of the semiconductor package 204 designated by reference number 218 in FIG. 2B. FIG. 2C shows the first array of connectors 214 on the substrate 206 and the second array of connectors 216 on the connection portion 212, as described in connection with the apparatus 100. For example, the connection portion 212 may include a setback area 220, in a similar manner as described in connection with the apparatus 100. In some implementations, the bottom surface of the connection portion 212 may include a solder mask layer having openings (e.g., resulting from a photolithography procedure) that define and control locations of the connectors 216, in a similar manner as described in connection with the apparatus 100.

In some implementations, a method (e.g., performed by semiconductor manufacturing equipment) may include applying (e.g., placing) the semiconductor package 204 to the circuit board 202. The method may include bonding the semiconductor package 204 to the circuit board 202 at the first array of connectors 214 and at the second array of connectors 216. In some implementations, bonding the semiconductor package 204 to the circuit board 202 may include performing a reflow operation.

As indicated above, FIGS. 2A-2C are provided as an example. Other examples may differ from what is described with regard to FIGS. 2A-2C.

Figure 3A:
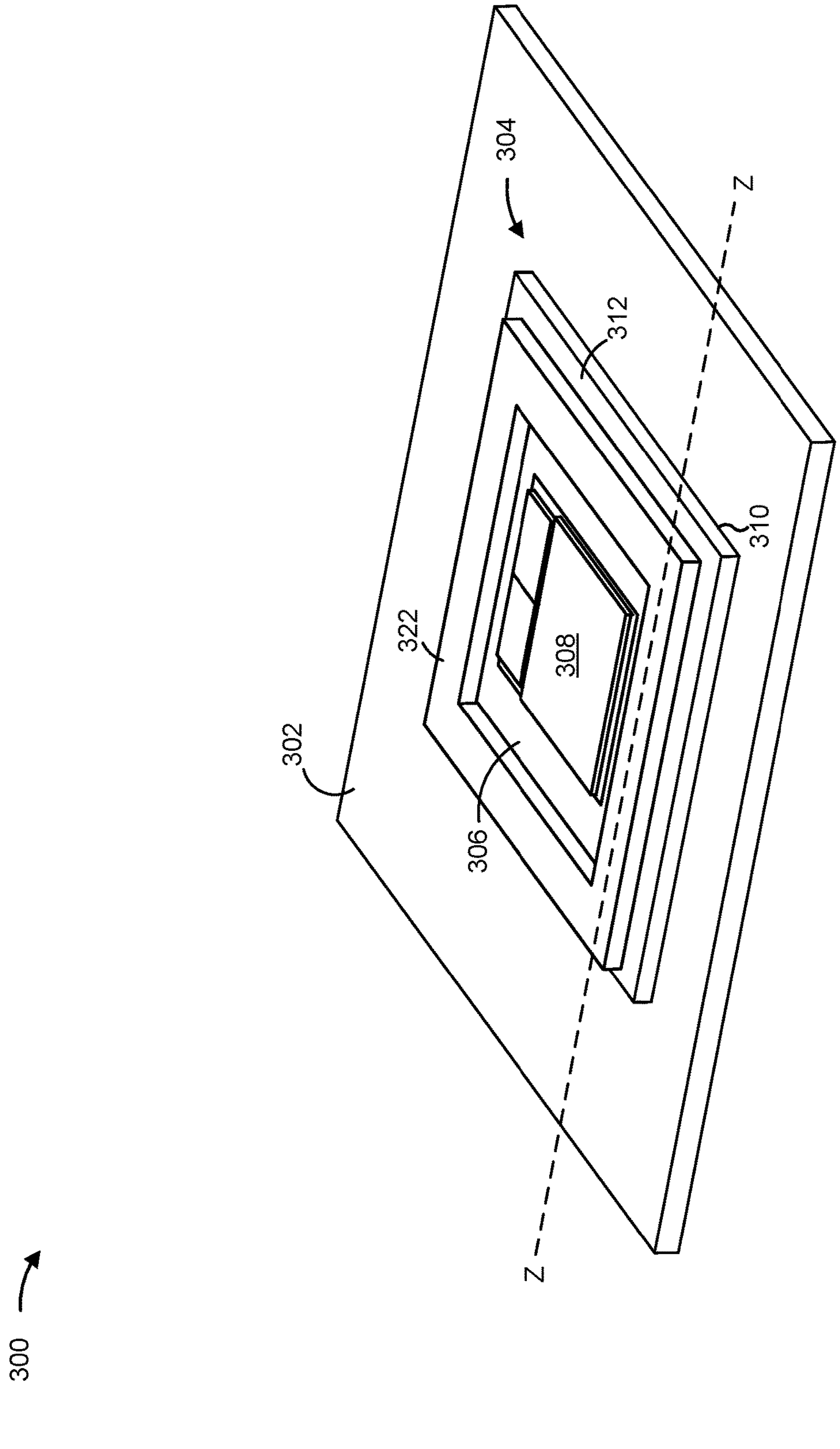
FIG. 3A is a perspective view of an example apparatus.
Figure 3B:
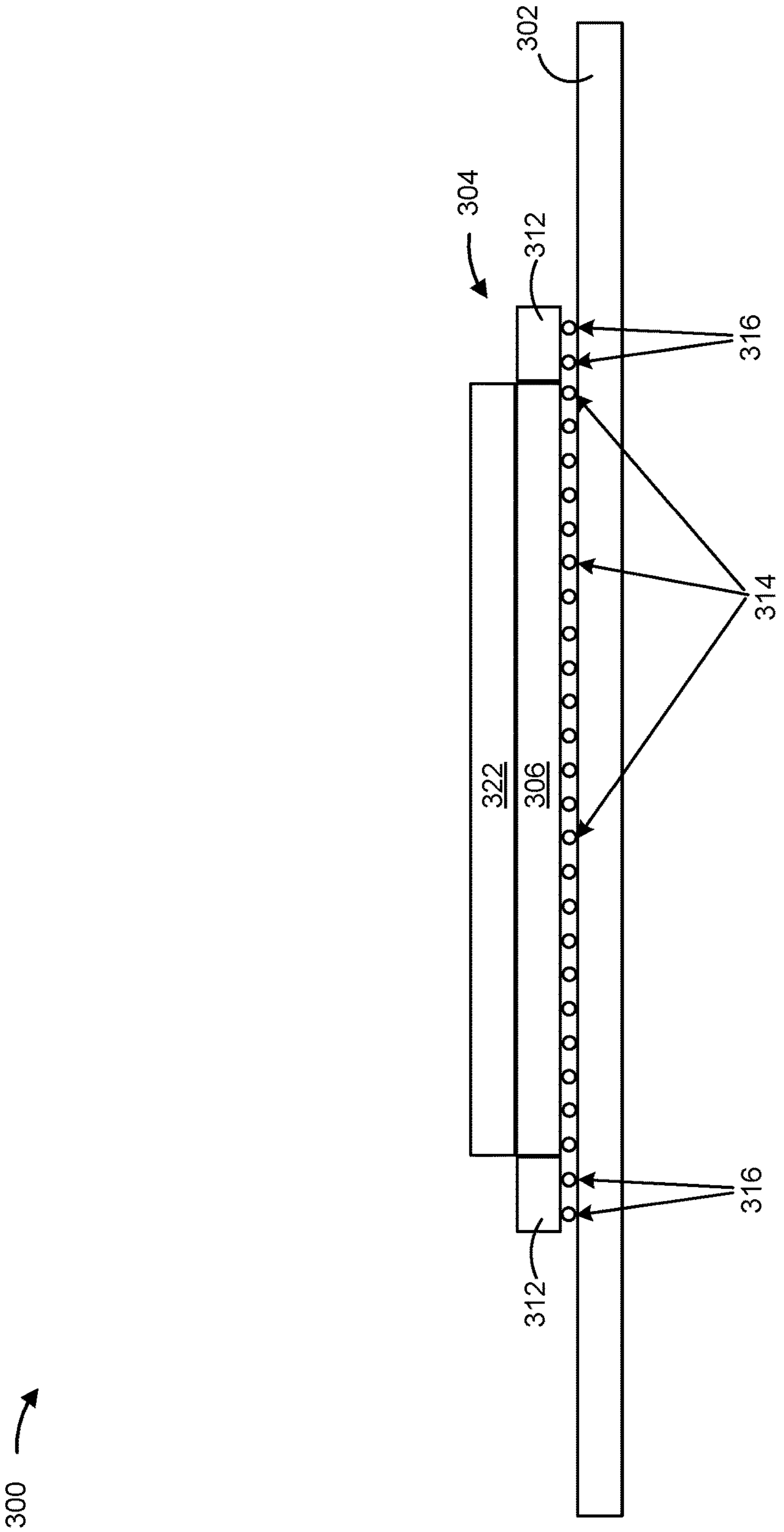
FIG. 3B is a cross-sectional view of the apparatus of FIG. 3A taken along line Z-Z.

FIG. 3A is a perspective view of an example apparatus 300, FIG. 3B is a cross-sectional view of the apparatus 300 taken along line Z-Z. As shown in FIGS. 3A-3B, the apparatus 300 may include a circuit board 302 and a semiconductor package 304 disposed on, and connected to, the circuit board 302, as described in connection with the apparatus 100. The semiconductor package 304 may include a substrate 306, having a top surface and a bottom surface, and one or more semiconductor devices 308, disposed on the top surface of the substrate 306, as described in connection with the apparatus 100.

As shown in FIGS. 3A-3B, the semiconductor package 304 may include a stiffener 310 having a connection portion 312 that extends along an entirety of a side edge (e.g., between the top surface and the bottom surface) of the substrate 306. In some implementations, the connection portion 312 of the stiffener 310 may encompass an entirety of the stiffener 310, as shown. In some implementations, the stiffener 310 may include multiple (e.g., discrete) connection portions 312, in a similar manner as described above in connection with the apparatus 100, and each connection portion 312 may extend along a respective portion of the side edge of the substrate 306. For example, the stiffener 310 may include up to four L-shaped connection portions 312 that extend respectively along the corners of the substrate 306, in a similar manner as described above in connection with the apparatus 100. In some implementations, the stiffener 310 (e.g., the connection portion 312) may be affixed to the side edge of the substrate 306 by an adhesive, an adhesive tape, an adhesive film, or the like. A bottom surface of the connection portion 312 may be coplanar with the bottom surface of the substrate 306. In some implementations, the semiconductor package 304 may include an additional stiffener 322 disposed on the top surface of the substrate 306 and surrounding the semiconductor device(s) 308, as described herein.

As shown in FIG. 3B, the semiconductor package 304 may include a first array of (e.g., a plurality of) connectors 314, on the bottom surface of the substrate 306, as described above in connection with the apparatus 100. The semiconductor package 304 may include a second array of connectors 316, on a bottom surface of the connection portion 312, as described above in connection with the apparatus 100. For example, connectors 316, of the second array of connectors 316, may be dummy connectors, that provide dummy connections to the circuit board 302, and that have the purpose of increasing the strength of a mechanical connection between the semiconductor package 304 and the circuit board 302, as described herein. For example, in a prior device, solder joints may experience a stress of about 151 MPa, whereas stress at solder joints may be decreased to about 64 MPa using the stiffener 310. In addition, in a prior device, a normalized characteristic life of solder joints may be about 1 cycle, whereas a normalized characteristic life may be about 4.43 cycles using the stiffener 310. In some implementations, the bottom surface of the connection portion 312 may include a solder mask layer having openings (e.g., resulting from a photolithography procedure) that define and control locations of the connectors 316, in a similar manner as described in connection with the apparatus 100.

In some implementations, a method (e.g., performed by semiconductor manufacturing equipment) may include applying (e.g., placing) the semiconductor package 304 to the circuit board 302. The method may include bonding the semiconductor package 304 to the circuit board 302 at the first array of connectors 314 and at the second array of connectors 316. In some implementations, bonding the semiconductor package 304 to the circuit board 302 may include performing a reflow operation.

As indicated above, FIGS. 3A-3B are provided as an example. Other examples may differ from what is described with regard to FIGS. 3A-3B.

Figure 4:
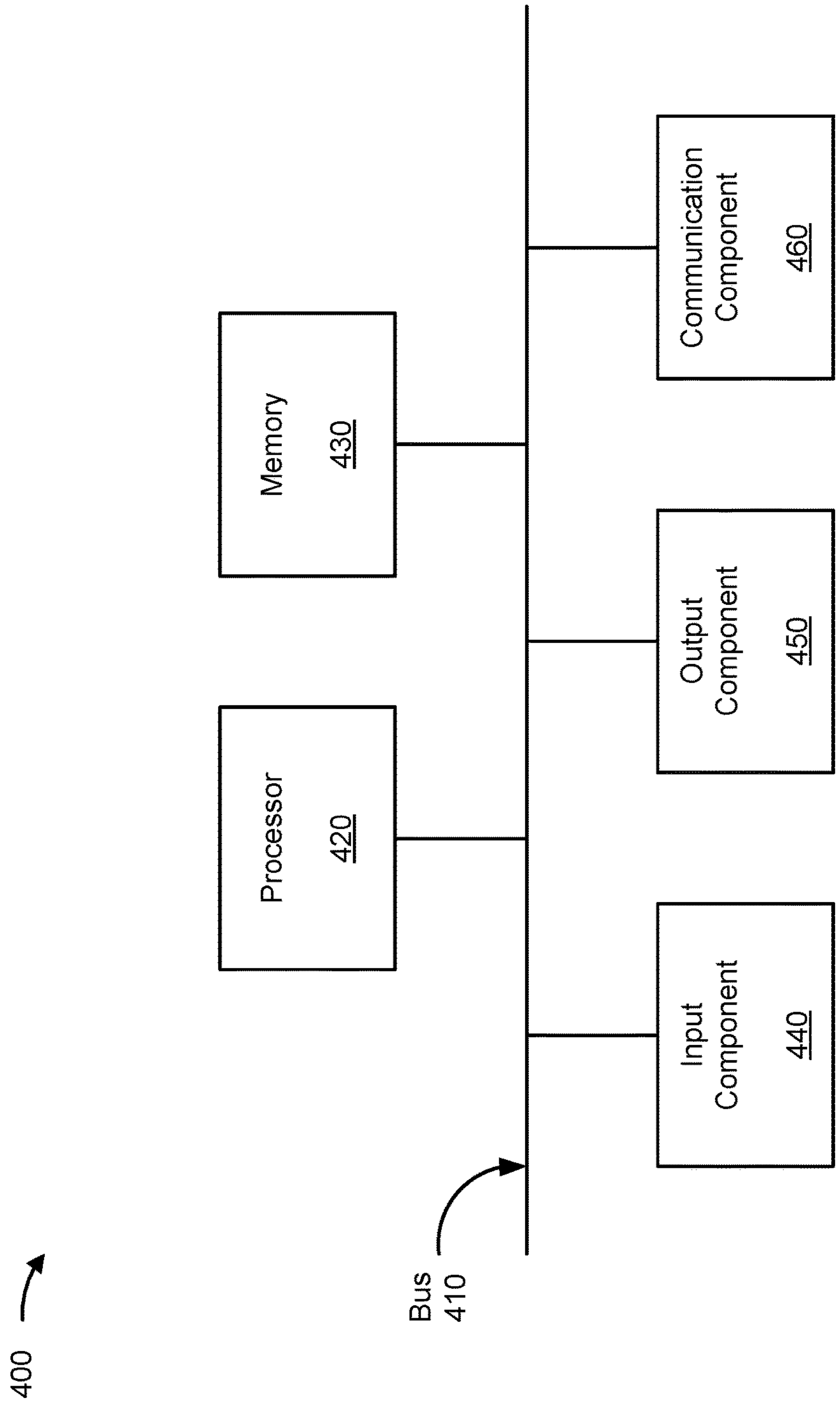
FIG. 4 is a diagram of example components of a device.

FIG. 4 is a diagram of example components of a device 400, which may correspond to the semiconductor package 104, the semiconductor package 204, and/or the semiconductor package 304. In some implementations, the semiconductor package 104, the semiconductor package 204, and/or the semiconductor package 304 may include one or more devices 400 and/or one or more components of the device 400. As shown in FIG. 4, the device 400 may include a bus 410, a processor 420, a memory 430, an input component 440, an output component 450, and/or a communication component 460.

The bus 410 may include one or more components that enable wired and/or wireless communication among the components of the device 400. The bus 410 may couple together two or more components of FIG. 4, such as via operative coupling, communicative coupling, electronic coupling, and/or electric coupling. For example, the bus 410 may include an electrical connection (e.g., a wire, a trace, and/or a lead) and/or a wireless bus. The processor 420 may include a central processing unit, a graphics processing unit, a microprocessor, a controller, a microcontroller, a digital signal processor, a field-programmable gate array, an application-specific integrated circuit, and/or another type of processing component. The processor 420 may be implemented in hardware, firmware, or a combination of hardware and software. In some implementations, the processor 420 may include one or more processors capable of being programmed to perform one or more operations or processes described elsewhere herein.

The memory 430 may include volatile and/or nonvolatile memory. For example, the memory 430 may include random access memory (RAM), read only memory (ROM), a hard disk drive, and/or another type of memory (e.g., a flash memory, a magnetic memory, and/or an optical memory). The memory 430 may include internal memory (e.g., RAM, ROM, or a hard disk drive) and/or removable memory (e.g., removable via a universal serial bus connection). The memory 430 may be a non-transitory computer-readable medium. The memory 430 may store information, one or more instructions, and/or software (e.g., one or more software applications) related to the operation of the device 400. In some implementations, the memory 430 may include one or more memories that are coupled (e.g., communicatively coupled) to one or more processors (e.g., processor 420), such as via the bus 410. Communicative coupling between a processor 420 and a memory 430 may enable the processor 420 to read and/or process information stored in the memory 430 and/or to store information in the memory 430.

The input component 440 may enable the device 400 to receive input, such as user input and/or sensed input. For example, the input component 440 may include a touch screen, a keyboard, a keypad, a mouse, a button, a microphone, a switch, a sensor, a global positioning system sensor, an accelerometer, a gyroscope, and/or an actuator. The output component 450 may enable the device 400 to provide output, such as via a display, a speaker, and/or a light-emitting diode. The communication component 460 may enable the device 400 to communicate with other devices via a wired connection and/or a wireless connection. For example, the communication component 460 may include a receiver, a transmitter, a transceiver, a modem, a network interface card, and/or an antenna.

The device 400 may perform one or more operations or processes described herein. For example, a non-transitory computer-readable medium (e.g., memory 430) may store a set of instructions (e.g., one or more instructions or code) for execution by the processor 420. The processor 420 may execute the set of instructions to perform one or more operations or processes described herein. In some implementations, execution of the set of instructions, by one or more processors 420, causes the one or more processors 420 and/or the device 400 to perform one or more operations or processes described herein. In some implementations, hardwired circuitry may be used instead of or in combination with the instructions to perform one or more operations or processes described herein. Additionally, or alternatively, the processor 420 may be configured to perform one or more operations or processes described herein. Thus, implementations described herein are not limited to any specific combination of hardware circuitry and software.

The number and arrangement of components shown in FIG. 4 are provided as an example. The device 400 may include additional components, fewer components, different components, or differently arranged components than those shown in FIG. 4. Additionally, or alternatively, a set of components (e.g., one or more components) of the device 400 may perform one or more functions described as being performed by another set of components of the device 400.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor package, comprising:
a substrate having a top surface and a bottom surface;
a first ball grid array on the bottom surface of the substrate;
a semiconductor device disposed on the top surface of the substrate;
a stiffener disposed on the top surface of the substrate and surrounding the semiconductor device, the stiffener including a connection portion that overhangs the substrate and extends toward the bottom surface of the substrate,
wherein a bottom surface of the connection portion is coplanar with the bottom surface of the substrate; and
a second ball grid array on the bottom surface of the connection portion, wherein the second ball grid array is spaced from the first ball grid array by a setback area of the connection portion.

2. The semiconductor package of claim 1,
wherein the first ball grid array has electrical connections to the substrate, and
wherein the second ball grid array is electrically isolated from the substrate.

3. The semiconductor package of claim 1,
wherein the semiconductor package includes multiple connection portions.

4. The semiconductor package of claim 1,
wherein the connection portion is a first connection portion that extends from a first corner of the stiffener, and
wherein the stiffener further comprises:
a second connection portion that extends from a second corner of the stiffener.

5. The semiconductor package of claim 4,
wherein the stiffener further comprises:
a third connection portion that extends from a third corner of the stiffener; and
a fourth connection portion that extends from a fourth corner of the stiffener.

6. The semiconductor package of claim 1,
wherein the connection portion extends along at least a portion of a side edge of the substrate.

7. The semiconductor package of claim 1,
wherein the connection portion surrounds a side edge of the substrate.

8. The semiconductor package of claim 1,
wherein the semiconductor device comprises an application-specific integrated circuit (ASIC).

9. An apparatus, comprising:
a substrate having a top surface and a bottom surface;
a first array of connectors on the bottom surface of the substrate;
a semiconductor device disposed on the top surface of the substrate;
a stiffener having a connection portion that extends along at least a portion of a side edge of the substrate,
wherein a bottom surface of the connection portion is coplanar with the bottom surface of the substrate; and
a second array of connectors on the bottom surface of the connection portion, wherein the second array of connectors is spaced from the first array of connectors by a setback area of the connection portion.

10. The apparatus of claim 9,
wherein the connection portion surrounds the side edge of the substrate.

11. The apparatus of claim 9,
wherein the stiffener is disposed on the top surface of the substrate and surrounds the semiconductor device, and
wherein the connection portion of the stiffener overhangs the substrate and extends toward the bottom surface of the substrate.

12. The apparatus of claim 9,
wherein the stiffener is a first stiffener, and
wherein the apparatus further comprises:
a second stiffener disposed on the top surface of the substrate and surrounding the semiconductor device.

13. The apparatus of claim 9,
wherein the first array of connectors is a first ball grid array and the second array of connectors is a second ball grid array.

14. The apparatus of claim 9, further comprising:
a circuit board,
wherein the substrate is connected to the circuit board via the first array of connectors and the second array of connectors,
wherein the first array of connectors provide a communicative connection to the circuit board, and
wherein the second array of connectors provide a dummy connection to the circuit board.

15. A stiffener for a semiconductor package, comprising:
a frame having a top surface, a bottom surface, and a central opening extending through the top surface and the bottom surface;
a connection portion extending from the frame perpendicular to the bottom surface; and
a first array of connectors on the connection portion, wherein the first array of connectors is spaced from a second array of connectors by a setback area of the connection portion.

16. The stiffener of claim 15,
wherein the connection portion is a first connection portion that extends from a first corner of the frame, and
wherein the stiffener further comprises:
a second connection portion that extends from a second corner of the frame.

17. The stiffener of claim 16, further comprising:

a third connection portion that extends from a third corner of the frame; and a fourth connection portion that extends from a fourth corner of the frame.

18. The stiffener of claim 15, wherein the connection portion extends along at least a portion of a perimeter of the frame.

19. The stiffener of claim 15, wherein the connection portion extends along an entirety of a perimeter of the frame.

20. The stiffener of claim 15, wherein a minimum thickness of the setback area is greater than a pitch of the second array of connectors.

* * * * *